United States Patent
Jacob et al.

(10) Patent No.: US 10,396,121 B2
(45) Date of Patent: Aug. 27, 2019

(54) FINFETS FOR LIGHT EMITTING DIODE DISPLAYS

(71) Applicant: GLOBALFOUNDRIES INC., Grand Cayman (KY)

(72) Inventors: Ajey P. Jacob, Watervliet, NY (US); Srinivasa Banna, San Jose, CA (US); Deepak Nayak, Union City, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 37 days.

(21) Appl. No.: 15/680,948

(22) Filed: Aug. 18, 2017

(65) Prior Publication Data

US 2019/0058002 A1 Feb. 21, 2019

(51) Int. Cl.
| | | |
|---|---|---|
| *H01L 27/15* | (2006.01) | |
| *H01L 33/06* | (2010.01) | |
| *H01L 33/24* | (2010.01) | |
| *H01L 33/00* | (2010.01) | |
| H01L 33/32 | (2010.01) | |
| H01L 33/60 | (2010.01) | |

(Continued)

(52) U.S. Cl.
CPC .......... *H01L 27/153* (2013.01); *H01L 33/007* (2013.01); *H01L 33/06* (2013.01); *H01L 33/24* (2013.01); *H01L 29/785* (2013.01); *H01L 33/32* (2013.01); *H01L 33/502* (2013.01); *H01L 33/504* (2013.01); *H01L 33/60* (2013.01); *H01L 2933/0041* (2013.01); *H01L 2933/0058* (2013.01)

(58) Field of Classification Search
CPC ..... H01L 27/153; H01L 27/156; H01L 33/08; H01L 33/24; H01L 33/60
See application file for complete search history.

(56) References Cited

U.S. PATENT DOCUMENTS

| 5,813,753 A | 9/1998 | Vriens et al. |
|---|---|---|
| 7,667,238 B2 | 2/2010 | Erchak et al. |

(Continued)

OTHER PUBLICATIONS

You et al., "Light extraction enhanced white light-emitting diodes with multi-layered phosphor configuration", Optics Express, vol. 18, No. 5, Mar. 1, 2010, pp. 5055-5060.

(Continued)

*Primary Examiner* — Tuan A Hoang
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to finFETs for light emitting diode displays and methods of manufacture. The method includes: forming replacement fin structures with a doped core region, on doped substrate material; forming quantum wells over the replacement fin structures; forming a first color emitting region by doping at least one of the quantum wells over at least a first replacement fin structure of the replacement fin structures, while protecting at least a second replacement fin structure of the replacement fin structures; and forming a second color emitting region by doping another one of the quantum wells over the at least second replacement fin structure of the replacement fin structures, while protecting the first replacement fin structure and other replacement fin structures which are not to be doped.

20 Claims, 10 Drawing Sheets

(51) Int. Cl.
*H01L 33/50* (2010.01)
*H01L 29/78* (2006.01)

(56) References Cited

U.S. PATENT DOCUMENTS

| | | | |
|---|---|---|---|
| 7,646,033 B2 | 10/2010 | Tran et al. | |
| 8,163,581 B1 | 4/2012 | Or-Bach et al. | |
| 8,168,998 B2 | 5/2012 | David et al. | |
| 8,835,965 B2* | 9/2014 | Zhang | H01L 33/04 257/98 |
| 2009/0039359 A1* | 2/2009 | Yoon | H01L 33/382 257/88 |
| 2009/0278153 A1 | 11/2009 | Cho | |
| 2010/0081218 A1 | 4/2010 | Hardin | |
| 2011/0001151 A1 | 1/2011 | Le Toquin | |
| 2011/0266560 A1 | 11/2011 | Basin et al. | |
| 2011/0300644 A1 | 12/2011 | Akimoto et al. | |
| 2012/0229773 A1* | 9/2012 | Mochizuki | G02B 6/122 353/30 |
| 2013/0112944 A1 | 5/2013 | Cha et al. | |
| 2013/0175558 A1 | 7/2013 | Orsley et al. | |
| 2013/0240348 A1* | 9/2013 | Mi | H01L 31/03044 204/157.5 |
| 2014/0273398 A1* | 9/2014 | Holland | H01L 21/76 438/400 |
| 2016/0093665 A1* | 3/2016 | Schubert | H01L 27/15 257/13 |
| 2017/0018685 A1* | 1/2017 | Cho | H01L 33/007 |
| 2017/0229429 A1* | 8/2017 | He | B82Y 20/00 |
| 2017/0323925 A1* | 11/2017 | Schneider, Jr. | H01L 33/007 |

OTHER PUBLICATIONS

Wang et al., "Modeling on phosphor sedimentation phenomenon during curing process of high power LED packaging", Journal of Solid State Lighting, 2014, pp. 1-9, <http://www.journalofsolidstatelighting.com/content/1/1/2>.

Yeh et al., "Vertical nonpolar growth templates for light emitting diodes formed with GaN nanosheets", Appl. Phys. Lett., 2012.

Wang et al., "Color-turnable, phosphor-free InGaN nanowire light-emitting diode arrays monolithically integrated on silicon", Optics Express, vol. 22, No. S7, Dec. 15, 2014, DOI:10.1364/OE.22.0A1768, pp. A1768-A1775.

Xie et al., "On the efficiency droop in InGaN multiple quantum well blue light emitting diodes and its reduction with p-doped quantum well barriers", Applied Physics Letters, vol. 93, 2008, pp. 121107-1-121107-2. <http://scholarscompass.vcu.edu/egre_pubs/89>.

Weyers, "Substrates for GaN Technology", Ferdinand-Braun Insitut., Oct. 2005, pp. 1-24.

Yang et al., "Enhancement in Light Extraction Efficiency of GaN-Based Light-Emitting Diodes Using Double Dielectric Surface Passivation", Optics and Photonics Journal, No. 2, 2012, pp. 185-192, <http://dx.doi.org/10.4236/ppj.2012.23028>.

Finson et al., "Transparent SiO2 Barrier Coatings: Conversion and Production Status", Society of Vacuum Coaters, No. 505/856-7188, 1994, pp. 139-143.

* cited by examiner

US 10,396,121 B2

FINFETS FOR LIGHT EMITTING DIODE DISPLAYS

FIELD OF THE INVENTION

The present disclosure generally relates to semiconductor structures and, more particularly, to finFETs for light emitting diode displays and methods of manufacture.

BACKGROUND

Light-emitting diodes (LEDs) are used in displays for many different types of devices. The LED displays can be made from finFET structures composed of different materials, including gallium-nitride-on-silicon (GaN-on-Si) or sapphire.

The formation of the LEDs is a challenge. For example, GaN has both a lattice mismatch and a thermal mismatch with Si, which can cause stresses in the structure, e.g., warping and cracks in the Si wafer. Also, as the indium (In) concentration increases, the lattice mismatch between the GaN and Si also increases. Moreover, the solid solubility of In in GaN can be very low, which leads to a large amount of growth defects in the GaN.

SUMMARY

In an aspect of the disclosure, a method comprises: forming replacement fin structures with a doped core region, on doped substrate material; forming quantum wells over the replacement fin structures; forming a first color emitting region by doping at least one of the quantum wells over at least a first replacement fin structure of the replacement fin structures, while protecting at least a second replacement fin structure of the replacement fin structures; and forming a second color emitting region by doping another one of the quantum wells over the at least second replacement fin structure of the replacement fin structures, while protecting the first replacement fin structure and other replacement fin structures which are not to be doped.

In an aspect of the disclosure, a method comprises: forming doped fin structures of a substrate material; recessing the doped fin structures; forming doped replacement fin structures on the recessed doped fin structures; forming alternating cladding layers on the doped replacement fin structures; forming a first mask over at least a first doped replacement fin structure; forming a first color emitting region over at least a second doped replacement fin structure, while protecting the first doped replacement fin structure with the mask; removing the first mask; forming second mask over the at least the first coloring emitting region and the second doped replacement fin structure; and forming a second color emitting region over at least a second doped replacement fin structure, while protecting the at least first coloring emitting region with the second mask.

In an aspect of the disclosure, a structure comprises: replacement fin structures comprising a doped core region; alternating cladding layers on the replacement fin structures; a first material over an uppermost cladding layer of the alternating cladding layers of a first doped placement fin structure of the replacement fin structures; a second material over an uppermost cladding layer of the alternating cladding layer of a second doped replacement fin structure of the replacement fin structures; and a third doped replacement fin structure which is devoid of the first and second materials, wherein the first and second materials are composed of one of quantum dots or spin on phosphors to produce a green color and a red color.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to finFETs for light emitting diode displays and methods of manufacture. The LED displays can be used in wearable devices, such as a head mount display for a virtual reality (VR)/augmented reality (AR), amongst other examples. In embodiments, the finFET structures are arranged to emit a plurality of colors. The arrangement can include quantum dots dispersed among the fin regions, i.e., nanowires, for color emission. In other embodiments, the arrangement includes phosphors dispersed among the fin regions for color emission.

In embodiments, the structures and methods described herein allow for finFET structures with the least amount of defects in a GaN core region. Also, additional advantages from the structures and methods described herein include: (i) the formation of GaN nanorods and nanosheets which produce zero dislocation, non-polar facets on which to grow LED active regions; (ii) creation of non-polar planes on conventional orientation substrates in order to access the advantages of nonpolar orientations without the cost of expensive substrates; (iii) 3D active regions which reduce efficiency droop associated with high current operation; (iv) nanostructures grown on Si or other low cost substrates to further reduce the manufacturing costs; and (v) use of quantum dot integration or phosphors integration to provide high efficiency color conversion.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
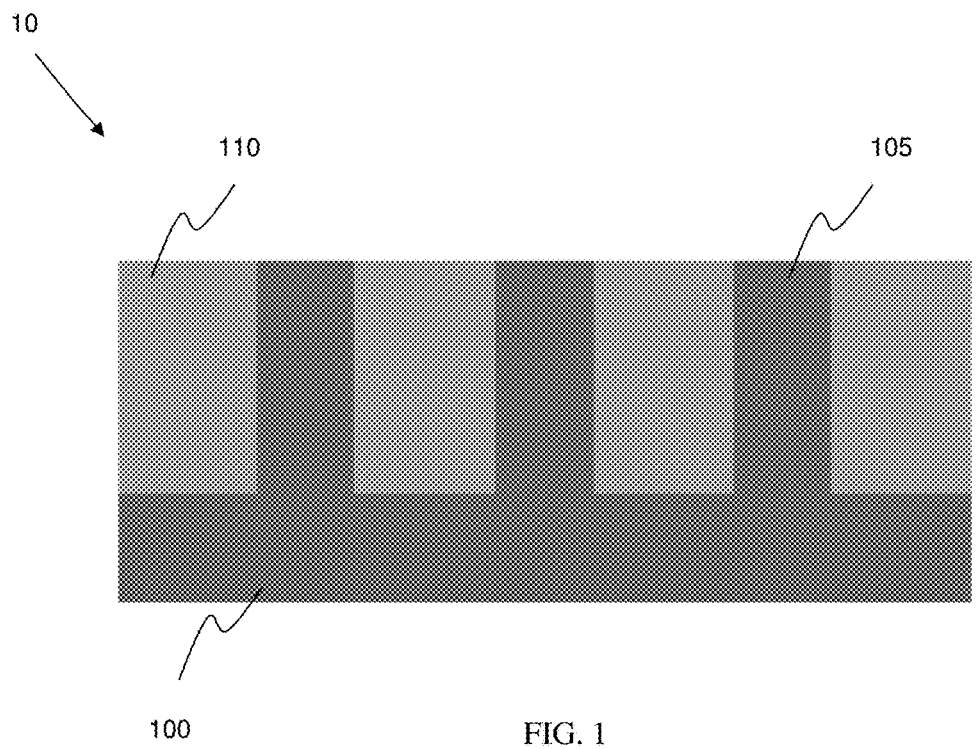
FIG. 1 shows an incoming fin structure, amongst other features, and respective fabrication processes in accordance with aspects of the present disclosure.

FIG. 1 shows a structure and respective fabrication processes in accordance with aspects of the present disclosure. In particular, FIG. 1 illustrates a finFET structure 10 comprising a substrate 100 which begins as a nanosheet for a light emitting diode (LED). In embodiments, the substrate 100 can be any appropriate semiconductor material, e.g., bulk Si, SiGe, SiGeC, SiC, 6H—SiC, GaAs, GaN, GaP, InAs, InN, InP, AlN, AlAs, LiAlO$_2$, sapphire and other III/V or II/VI compound semiconductors. The substrate 100 can be a doped substrate material heavily doped by implantation processes or in-situ doping techniques. Fin structures 105 are formed from the substrate 100, which can be doped individually, or already doped from the substrate 100. Therefore, the fin structures 105 can be doped fin structures.

The fin structures 105 can be formed by etching the substrate 100 using conventional patterning processes, e.g., conventional sidewall image transfer (SIT) processes or lithography and etching processes depending on the final width of the fin structures 105. For example, in the SIT technique, a mandrel is formed on the substrate 100 using conventional deposition processes, e.g., CVD. The mandrel material is different than the substrate 100, e.g., SiO$_2$. A resist is formed on the mandrel material, and exposed to light to form a pattern (openings). A RIE is performed through the openings to form the mandrels. Spacers are formed on the sidewalls of the mandrels which are preferably material that is different than the mandrels, and which are formed using conventional deposition processes known to those of skill in the art. More particularly, the spacers can have a width which matches the dimensions of the fin structures 105. For example, the fin structures 105 can have dimensions in a range of about 100 nm to 200 nm and more preferably about 10 nm to 50 nm, amongst other examples. The mandrels are removed or stripped using a conventional etching process, selective to the mandrel material. An etching is then performed within the spacing of the spacers to form the sub-lithographic features. The sidewall spacers can then be stripped.

Isolation regions 110 are formed between the fin structures 105. In embodiments, the isolation regions 110 can be an oxide material, such as SiO$_2$, deposited between the fin structures 105. The isolation regions 110 can be deposited to a height of the fin structures 105 using conventional deposition processes, e.g., chemical vapor deposition (CVD) processes. In alternate embodiments, the material of the isolation regions 110 can be deposited to a height above the fin structures 105, followed by a polishing process, e.g., a chemical mechanical polish (CMP), to a height of the fin structures 105.

Figure 2A:
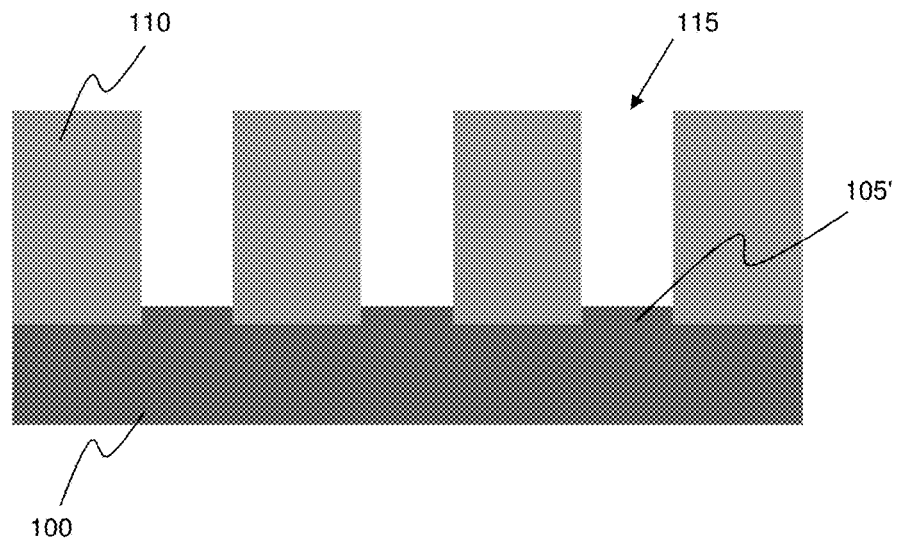
FIG. 2A shows the structure of FIG. 1 with recessed fin structures, amongst other features, and respective fabrication processes in accordance with aspects of the present disclosure.
Figure 2B:
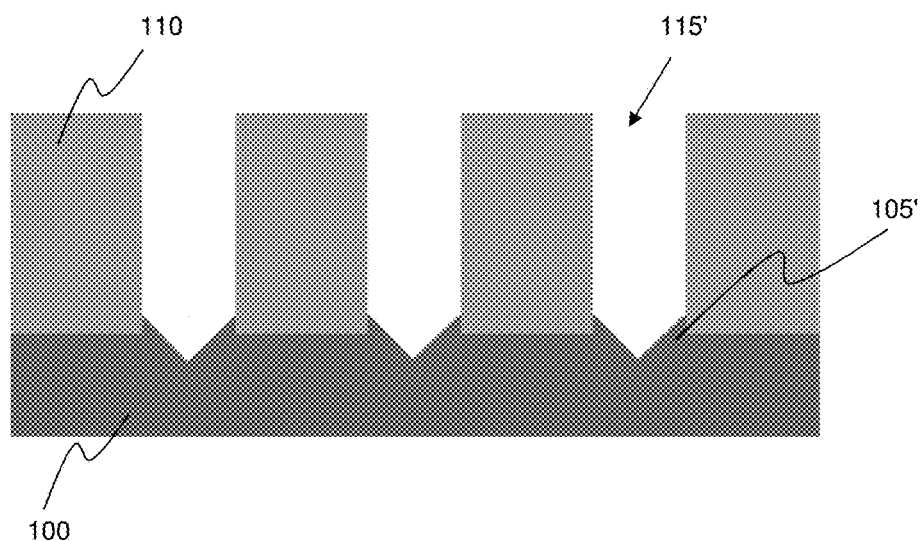
FIG. 2B shows etching in the [111] plane of the fin structures, amongst other features, and respective fabrication processes in accordance with aspects of the present disclosure.

FIGS. 2A and 2B show additional structures in accordance with aspects of the present disclosure. In FIG. 2A, the fin structures are recessed as represented by reference numeral 105', forming a recess or space 115 between the isolation regions 110. FIG. 2B shows the substrate 100, e.g., recessed fin structures 105', in a (111) plane to form the recesses 115' between the isolation regions 110. In FIGS. 2A and 2B, the recessed fin structures 105' are not completely removed, leaving a portion of the recessed fin structures 105' above the substrate 100 for subsequent processes. The recesses 115, 115' can be formed using conventional selective etching processes, e.g., RIE process.

Figure 3:
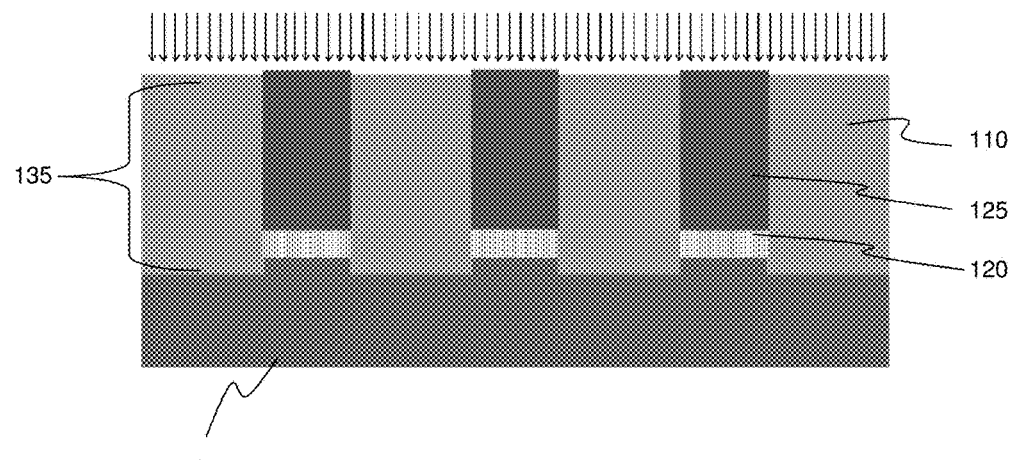
FIG. 3 shows multiple quantum well (MQW) regions, amongst other features, and respective fabrication processes in accordance with aspects of the present disclosure.

FIG. 3 shows replacement fin structures 135, i.e., part of the multiple quantum well (MQW) regions, grown within the recesses 115, 115', over the exposed recessed fin structures 105'. Specifically, replacement fin structures 135 include a buffer layer 120 formed under a core region 125. In embodiments, the buffer layer 120 can be, e.g., AlN, which can also be used as the material for the substrate 100. The buffer layer 120 can be deposited by a conventional deposition method, e.g., CVD processes, to a thickness of about 50 to 100 nanometers; although other dimensions are also contemplated herein. In further embodiments, the thickness of the buffer layer 120 can be in a range of about ⅕ to 1/10 of the thickness of the substrate 100. Following the deposition of the buffer layer 120, a core region 125 is grown on the buffer layer 120. The core region 125 can be, e.g., gallium nitride (GaN), used in light-emitting diodes. As should be understood by those of skill in the art, GaN has a wide band gap of 3.4 eV, which affords it special properties for applications in optoelectronic, high-power and high-frequency devices.

As further shown in FIG. 3, the core region 125 can be grown to a height of the isolation regions 110, i.e., planar with the isolation regions 110. Further, if the core region 125 is overgrown to a height higher than the isolation region 110, the core region 125 can be polished back to the surface of the isolation region 110 by a CMP process. In embodiments, the deposition of the buffer layer 120 and the core region 125 can occur on the (111) plane to form the replacement fin structures 135.

More specifically, the Si of the substrate 100 will have either a (111) or (110) plane for the GaN growth, i.e., the core region 125. This is because the Si (100) plane has more defects than either the (111) plane or the (110) plane. In embodiments, the buffer layer 120 and the core region 125, along with subsequently deposited cladding layers, can be used to form a quantum well region. As should be understood by those of skill in the art, a quantum well is a potential well with only discrete energy values. The classic model used to demonstrate a quantum well is to confine particles, which were originally free to move in three dimensions, to two dimensions, by forcing them to occupy a planar region.

FIG. 3 shows doping or ion implanting of the replacement fin structures 135, i.e., the core region 125, prior to the formation of cladding layers, to form a doped core region. Therefore, the buffer layer 120 can formed under a doped core region. In embodiments, the doping can be a heavy doping of the core region 125 with an n-type doping using various approaches. For example, the doping can be, e.g., ion implantation or in-situ doping of GaN material, e.g., core region 125, during the growth of the core region 125. In embodiments, the doping can be performed with an n-type dopant at approximately an energy level of 15 meV with a dopant resistivity of about 0.002 Ωcm. More specifically, the doped core region is comprised of an n-type GaN material. As another example, Mg can be used for the n-type dopant using an energy level of 160 meV with a dopant resistivity of about 0.2-2 Ωcm. As another alterative, Zn can be used as the n-type doping, at an energy level of about 340 meV and at a dopant resistivity of about 0.2-2 Ωcm.

Figure 4:
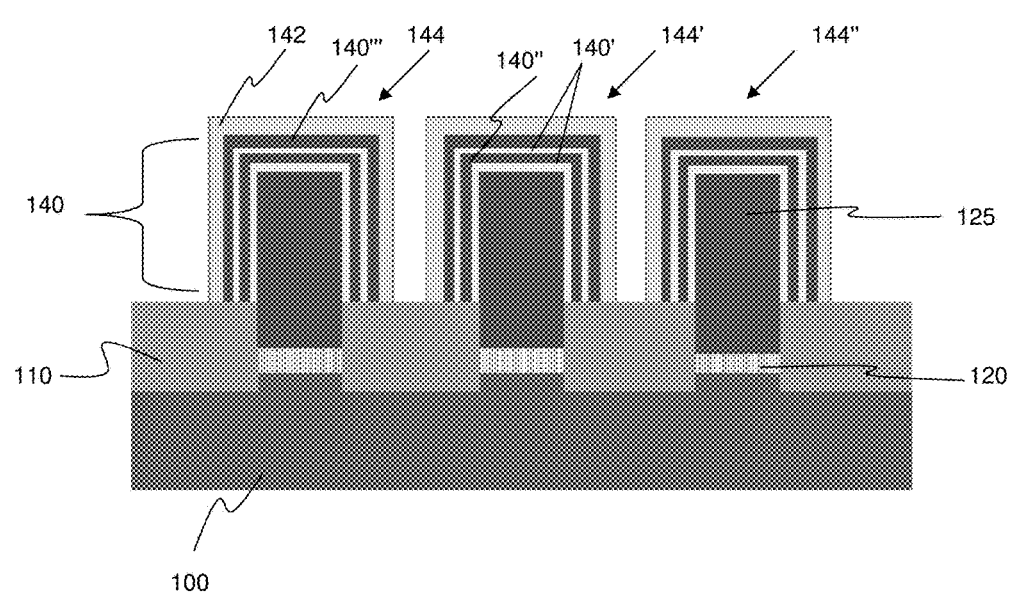
FIG. 4 shows cladded fin structures, amongst other features, and respective fabrication processes in accordance with aspects of the present disclosure.

FIG. 4 shows the isolation regions 110 recessed to a depth where minimal defects occur in the core region 125, followed by a deposition of several cladding layers 140 over the core region 125. More particularly, the recessed isolation regions 110 will cover defects in the GaN material, e.g., the core region 125. In embodiments, the isolation regions 110 can be recessed by a conventional RIE process, with selective chemistries, to below a surface of the core region 125.

FIG. 4 further shows several cladding layers 140, which are used to form a plurality of multiple quantum well regions 144, 144', 144". In embodiments, the multiple quantum well regions 144, 144', 144" are composed of an n-type doped core region 125, post doping processes, and cladding layers 140 composed of InGaN and GaN materials as described herein. For example, the cladding layers 140 can be comprised of alternating layers of InGaN/GaN/InGaN/GaN materials, i.e., alternating InGaN and GaN materials. For example, the InGaN layer 140' is deposited on the core region 125, with the GaN layer 140" deposited on the InGaN layer 140', followed by another InGaN layer 140'. A GaN layer 140''' is then deposited on the InGaN layer 140'. The GaN layers 140" can be n-type GaN, whereas the GaN layers 140''', i.e., the uppermost cladding layer, can be a p-type (p+) GaN layer, which can be used to form low resistive contacts in subsequent steps.

In embodiments, the InGaN layers 140' form the quantum wells, which may or may not be doped. As shown in FIG. 4, the InGaN layers (quantum wells) 140' are formed over the replacement fin structures 135. More specifically, the n-type doped core region 125 of the replacement fin structure 135 acts as buffer region for the quantum well 140', whereas the p-type GaN layer 140''' acts as the cap region of the quantum well 140'. In further embodiments, this could be reversed, with n-type doped core region 125 as the cap region and the p-type GaN layer 140''' as the buffer region. In embodiments, the cladding layers 140, i.e., the layers InGaN/GaN/InGaN/GaN, can each have a thickness of about less than 10 nm, and preferably in a range of about 3 nm to 10 nm. In embodiments, the alternating layers of InGaN/GaN/InGaN/GaN can be deposited by a conventional CVD process.

An insulator layer 142 can be conformally deposited on the GaN layer 140''' of the cladding layers 140. In embodiments, the insulator layer 142 is an insulating material such as SiN or SiO$_2$, as examples. Preferably, the insulator layer 142 is different than the material of the isolation region 110, e.g., SiO$_2$, so that subsequent etching process, e.g., selective removal of the isolation region 110, can be performed without an additional masking step. Also, as shown in FIG. 4, the isolation regions 110 will separate the cladding layers 140 from the buffer layer 120.

Figure 5:
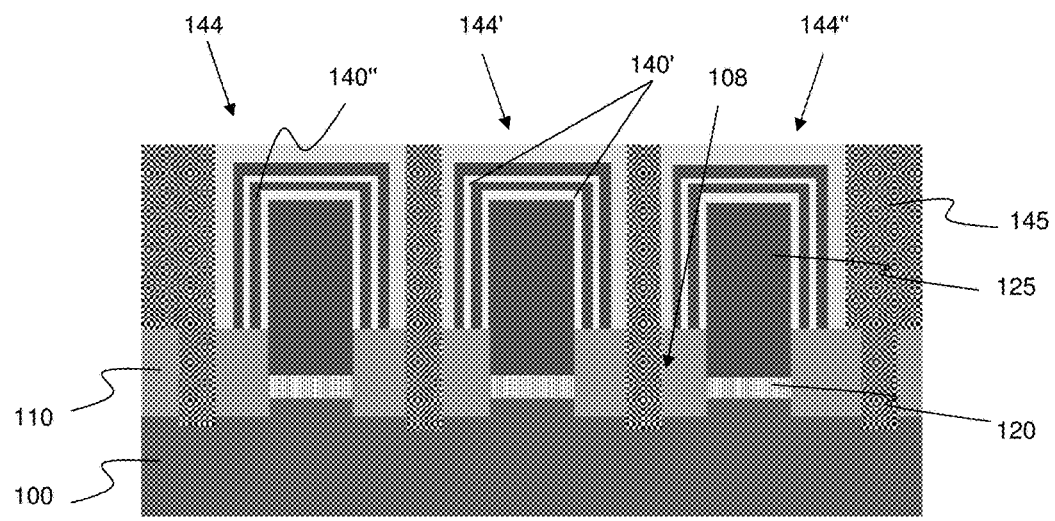
FIG. 5 shows contacts to the substrate, amongst other features, and respective fabrication processes in accordance with aspects of the present disclosure.

FIG. 5 shows a metal layer 145 formed in contact with the substrate 100. In embodiments, to deposit the metal layer 145, trenches or openings 108 are formed in the isolation region 110 by a RIE process. The trenches 108 will expose portions of the substrate 100 for subsequent contact formation. The metal layer 145 is deposited in the trenches 108 and between the insulator layer 142 of the different replacement fin structures 135, i.e., between the multiple quantum well regions 144, 144', 144". The metal layer 145 can be aluminum (Al), which serves as an ohmic contact to the substrate 100. Further, the metal layer 145 can be comprised of a reflective metal material. The metal layer 145 is polished by CMP to be planar with the insulator layer 142.

Figure 6:
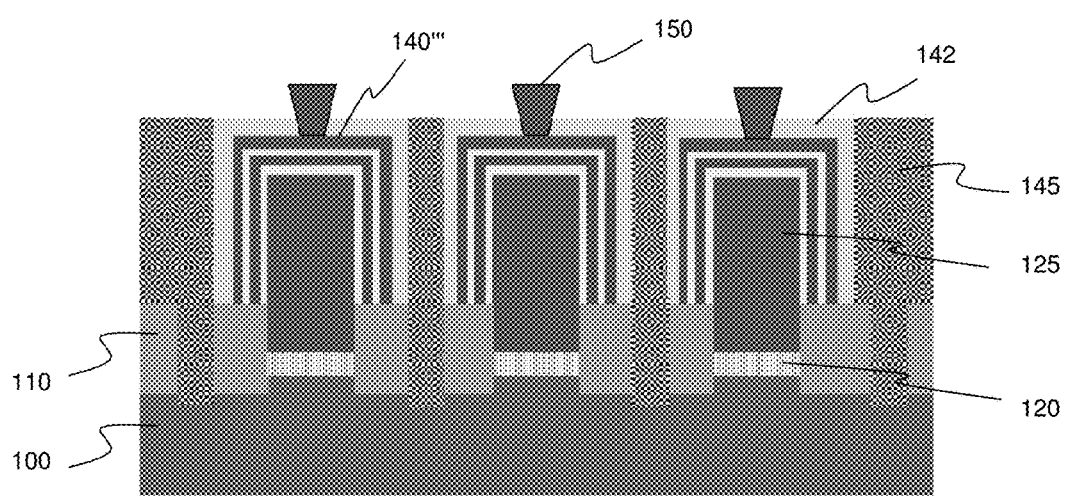
FIG. 6 shows contacts to the cladded fin structures, amongst other features, and respective fabrication processes in accordance with aspects of the present disclosure.

FIG. 6 shows the formation of contacts to the p-type GaN layer 140'''. In embodiments, the contacts 150 are preferably p-type contacts forming a p-junction to the p-type GaN layer 140''' of the cladding layers 140. The contacts 150 can be, e.g., palladium (Pd), nickel (Ni) or gold (Au), as examples. In embodiments, the contacts 150 can be formed by conventional lithography, etching and deposition processes. For example, a resist formed over the insulator layer 142 is exposed to energy (light) to form an opening. An etching process, e.g., RIE, is performed through the opening to form a via in the insulator layer 142, exposing the GaN layer 140'''. A metal layer, which is used to form the contacts 150, is then deposited within the via, followed by a CMP process, if desired.

Figure 7:
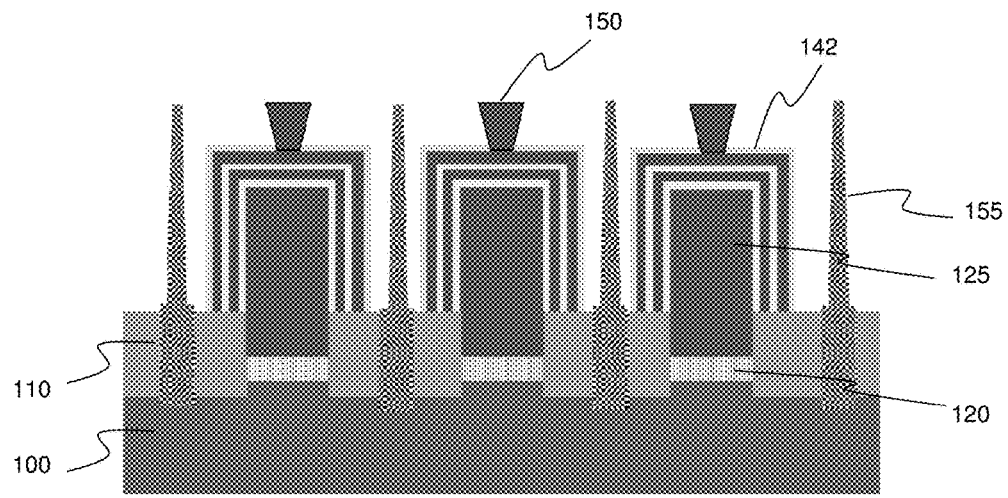
FIG. 7 shows mirrors, amongst other features, and respective fabrication processes in accordance with aspects of the present disclosure.

In FIG. 7, reflective mirrors 155 are formed by etching the metal layer 145 to provide integrated reflectors/reflective coating, and also to act as cathodes. The reflective mirrors 155 are formed between the insulator layer 142 of the different replacement fin structures 135, i.e., between the multiple quantum well regions 144, 144', 144". Further, the reflective mirrors 155 contact the underlying substrate 100.

Figure 8:
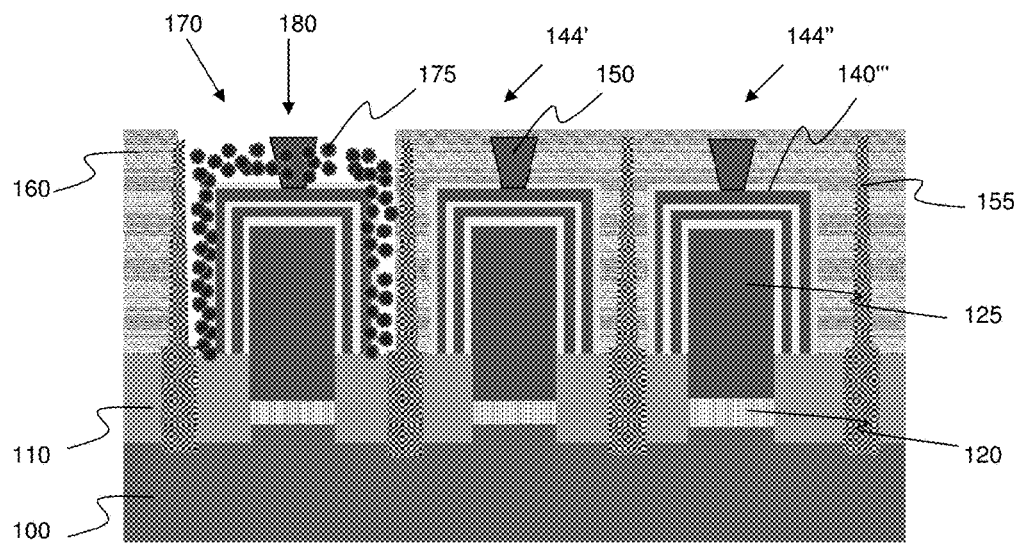
FIG. 8 shows a quantum well region, amongst other features, and respective fabrication processes in accordance with aspects of the present disclosure.

In FIG. 8, a hardmask 160 is applied over multiple quantum well regions 144', 144". The hardmask 160 can be any suitable hardmask material which protects the multiple quantum well regions 144', 144" from being doped. The hardmask 160 includes an opening 170 to expose the quantum well region 144 for doping, to form a first color emitting region, while the other quantum well regions 144', 144" remain protected. In this representation, the quantum well regions 144', 144" can be a green region and blue region, respectively; whereas, the quantum well region 144 is a red region. It should be understood by those of skill in the art that the quantum well regions 144, 144', 144" can be rearranged differently, e.g., a blue region, a green region and a red region, respectively.

Still referring to FIG. 8, a first quantum well (QW) material 175, which causes the emission of a red color, is deposited in the opening 170, over the quantum well region 144. More particularly, the insulator layer 142 that is over the uppermost cladding layer, i.e., GaN layer 140''', of the cladding layers 140, is doped to form the first color emitting region. In embodiments, the insulator layer 142, is part of the cladding layers 140, and by doping the insulator layer 142, the cladding layers 140, which include the quantum well 140', are also being doped. In embodiments, the first QW material 175 can be quantum dots (QD) deposited by a spin coat deposition, as an example. In other embodiments, the first QW material 175 can be phosphors deposited by a spin coat deposition. The hardmask 160 can then be removed by conventional stripant techniques. In this way, a red LED 180 is formed.

Figure 9:
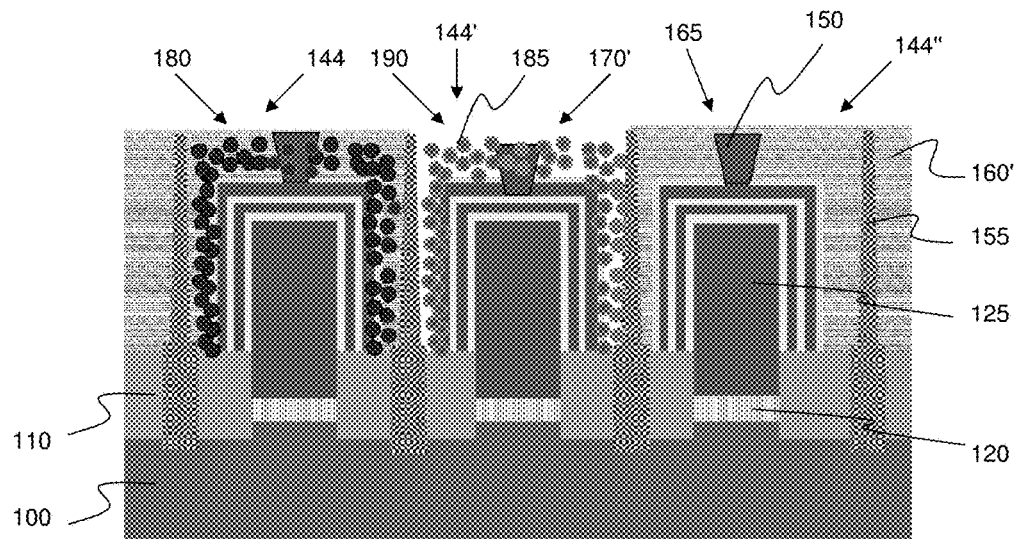
FIG. 9 shows another quantum well region, amongst other features, and respective fabrication processes in accordance with aspects of the present disclosure.

In FIG. 9, another hardmask 160' is applied over multiple quantum well regions, 144, 144" to protect the multiple quantum well regions 144, 144" from being doped. The hardmask 160' includes an opening 170' to expose the quantum well region 144' for doping to form a second color emitting region, while the other quantum well regions 144, 144", and particularly the replacement fin structures 135 of the quantum well regions 144, 144", remain protected. In this representation, the quantum well regions 144, 144" can be a red and blue region, respectively; whereas, the quantum well region 144', i.e., the second color emitting region, is a green region; although these quantum well regions 144, 144', 144" can be rearranged different as already noted herein.

In embodiments, a second QW material 185, is deposited within the opening 170', over the quantum well region 144', and therefore dopes the insulator layer 142 over an uppermost cladding layer, i.e., GaN layer 140''', of the cladding layers 140. Again, the insulator layer 142 can be part of the cladding layers 140, which include the quantum well 140'. Therefore, the cladding layers 140 can be doped by the second QW material 185. The doping with the second QW material 185, which causes the emission of a green color, can comprise quantum dots deposited by a spin coat deposition. In other embodiments, the doping with the second QW material 185 can comprise phosphors deposited by a spin coat deposition. The hardmask 160' can then be removed by conventional stripant techniques. In this way, a green LED 190 is formed. The remaining unexposed quantum well region 144" is a third color emitting region that will emit a blue light, which will be emitted from the blue LED 165. More specifically, the quantum well 140', i.e., the InGaN layers 140', will naturally emit a blue light without any doping processes because of the % of In in the cladding layers 140.

Figure 10:
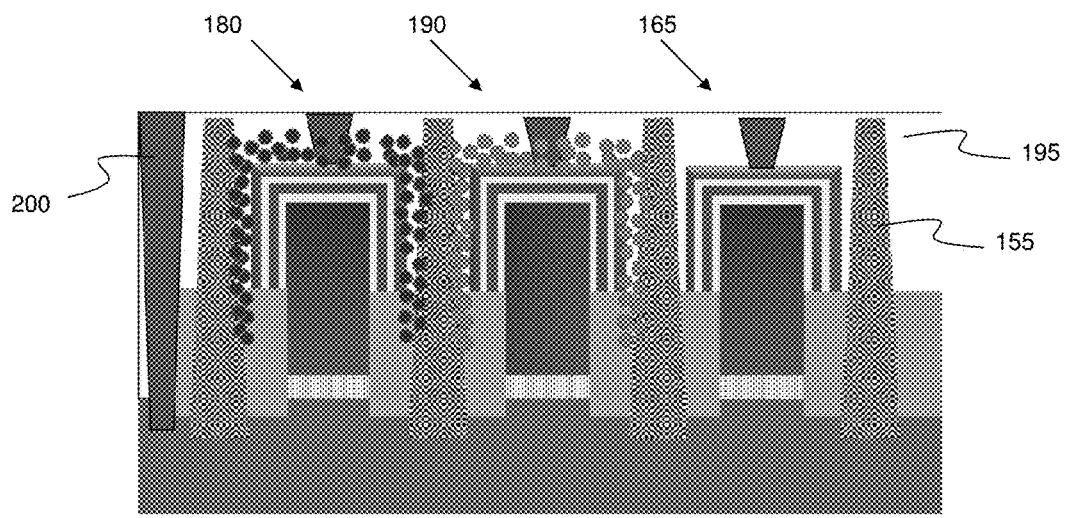
FIG. 10 shows a dielectric protecting the quantum well regions, amongst other features, and respective fabrication processes in accordance with aspects of the present disclosure.

In FIG. 10, a transparent dielectric material 195 is conformally deposited to protect the QW materials 175, 185 and to seal the first color emitting region, the second color emitting region and the third color emitting region, i.e., the quantum well regions 144, 144', 144". Specifically, the dielectric material 195 protects the quantum dots or the phosphors of the QW materials 175, 185 of the LEDs 180, 190, 165 from air exposure. More particularly, the transparent dielectric material 195 seals the replacement fin structures 135 and the reflective mirrors 155 with a dielectric layer, to form the light emitting diode structures 180, 190, 165. The dielectric material 195 can be, e.g., SiN or SiO$_2$ or a double dielectric, or other suitable transparent materials, amongst other examples, and can be deposited by a CVD process followed by a polish using CMP processes. An optional cathode 200 can also be formed by conventional lithography, etching and deposition processes. In embodiments, the cathode 200 serves as an additional cathode contact formation, if needed. Further, the reflective material, i.e., reflective mirrors 155, will also act as contact for the cathode 200.

Figure 11:
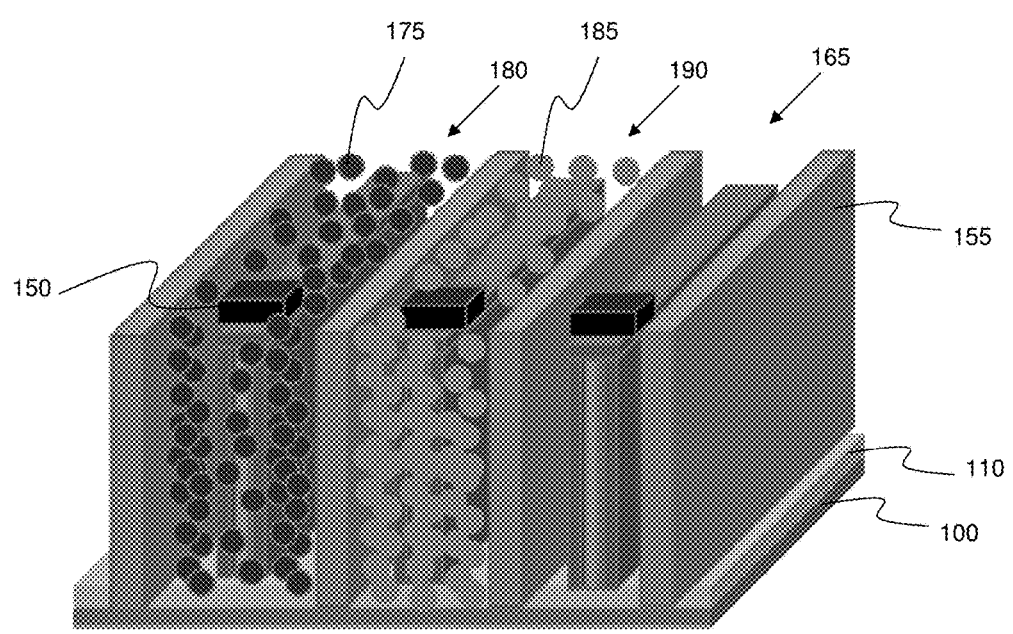
FIG. 11 shows a perspective of light emitting diodes and respective fabrication processes in accordance with aspects of the present disclosure.

FIG. 11 shows a perspective view of the LEDs 180, 190, 165 which provide the RGB colors emitted in displays. As shown in FIG. 11, the reflective mirrors 155 serve as reflective mirrors/contacts between the LEDs 180, 190, 165. In embodiments, a combination and/or blend of the RGB colors provided by the LEDs 180, 190, 165, form a single pixel.

Figure 12A:
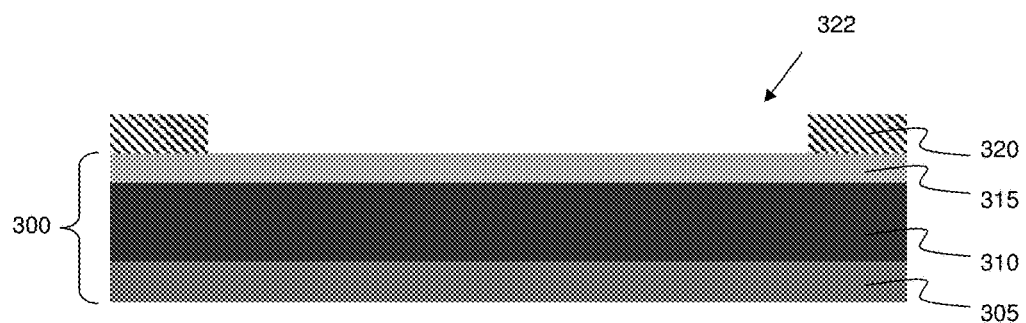
FIGS. 12A-16 show alternative structures, amongst other features, and respective fabrication processes in accordance with aspects of the present disclosure.
Figure 12B:
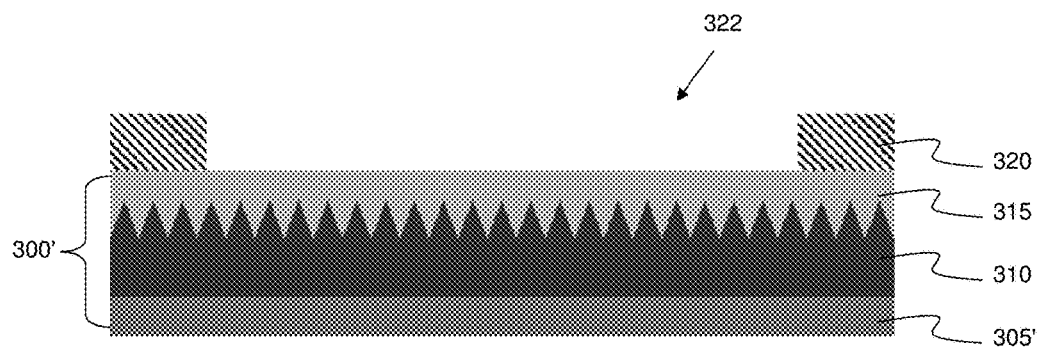

FIGS. 12A-16 illustrate alternative embodiments according to aspects of the present disclosure. In particular, FIG. 12A illustrates an LED substrate 300 comprising a Si (111) layer 305; whereas, FIG. 12B illustrates an LED substrate 300' comprising a Si (100) layer 305'. In both FIGS. 12A and 12B, an n-type layer 310 and buffer/nucleation layer 315 are formed on the Si layers 305, 305' respectively, using conventional deposition processes, e.g., CVD. In alternative embodiments, the substrate can be composed of, e.g., sapphire or SiC, in which case the n-type layer 310 can be eliminated. In FIG. 12B, a V-groove etch process exposes a surface of the Si (100) layer 305' in the (111) plane. The n-type layer 310 of FIGS. 12A and 12B can be, e.g., Si n-type. The buffer/nucleation layer 315 of FIGS. 12A and 12B includes AlN (approximately 50 nm to approximately 200 nm) and LT GaN (approximately 0.5 µm to approximately 2 µm) materials, as examples. A nitride layer 320, e.g., SiN, is formed over the buffer/nucleation layer 315. The nitride layer 320 can be patterned by conventional lithography and etching processes as described herein to form an opening or openings 322 for fabricating nanowires (e.g., GaN nanowires).

Figure 13:
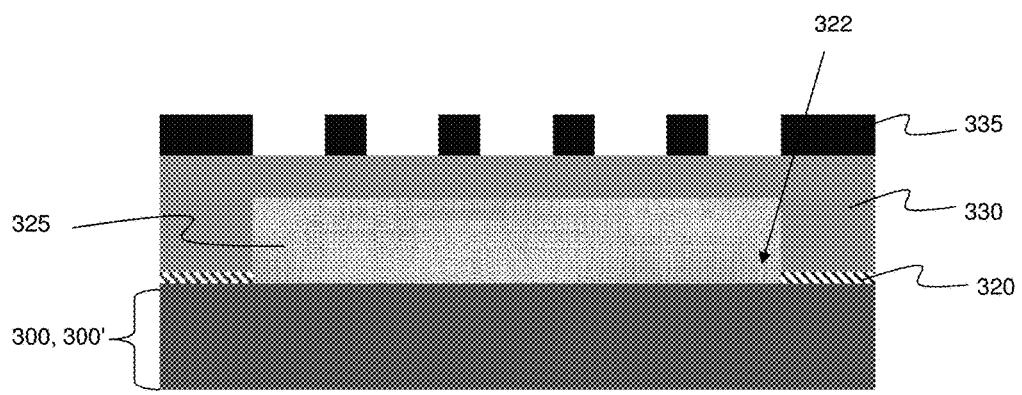

In FIG. 13, a core region 325 is grown on the substrate, i.e., 300, 300'. In embodiments, the core region 325 is a GaN material grown within the opening 322 of the nitride layer 320. The GaN material can be heavily doped with an n-type doping using various approaches. For example, the doping can be, e.g., ion implantation or in-situ doping of the GaN material, e.g., core region 325, during the growth of the core region 325. In embodiments, the doping can be performed with an n-type dopant like Mg or Zn, amongst other examples.

Following the growth of the core region 325, a nitride layer 330 is deposited over the core region 325 by conventional deposition methods, e.g., CVD, followed by a polish using CMP. A hardmask 335 is deposited over the nitride layer 330, which is patterned to form Red-Green-Blue (RGB) active areas. In embodiments, the RGB active areas include p-type selective areas where light, i.e., color, comes out. The patterning of the hardmask 335 can be performed using any conventional lithography and etching processes.

Figure 14:
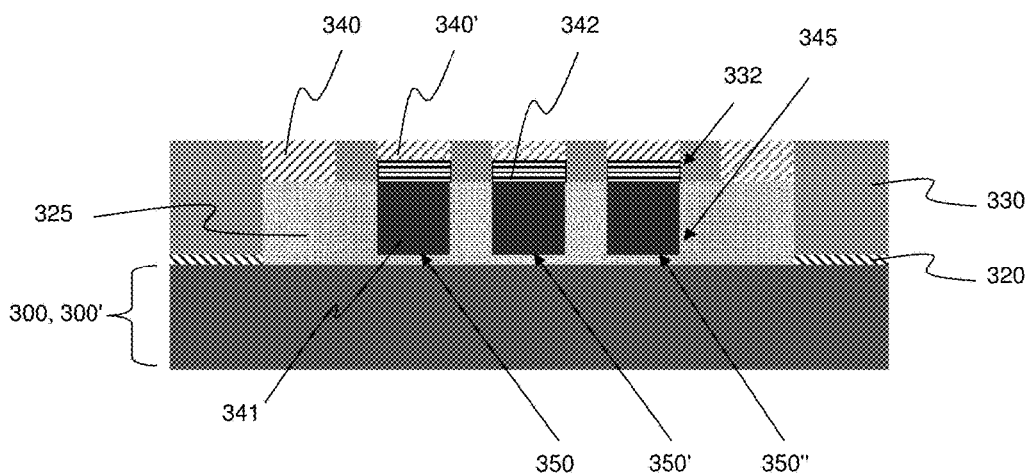

In FIG. 14, the openings in the hardmask 335 are used to pattern openings in the underlying nitride material 330. This patterning can be performed by conventional etching processes, e.g., RIE, with selective chemistries. The openings 332 are then filled with an insulator material 340, e.g., an oxide material, deposited using a conventional CVD process as an example. The insulator material 340 can then undergo a polishing step, e.g., CMP, to planarize the surface. An additional hardmask is deposited over the nitride layer 330 and insulator material 340 to open up an LED active area 345, exposing the core region 325, which forms the blue color emitting region 341.

Several cladding layers 342 are deposited in this opening over the blue color emitting regions 341, to form the multiple quantum well regions 350, 350', 350". The cladding layers 342 include several alternating layers of InGaN/GaN/InGaN/GaN materials. In embodiments, the alternating layers of InGaN/GaN/InGaN/GaN can be deposited by a conventional CVD process. The GaN layers in the cladding layers 342 can be n-type GaN, while the InGaN layers in the cladding layers 342, which form the quantum well, can have a varying In %. For example, the percentage of In within the InGaN layers can be approximately 15% to approximately 20%, allowing for an emission of a blue color. An insulator material 340' is depositing over the cladding layers 342 to seal the quantum well regions 350, 350', 350" followed by a polishing process, e.g., CMP.

Figure 15:
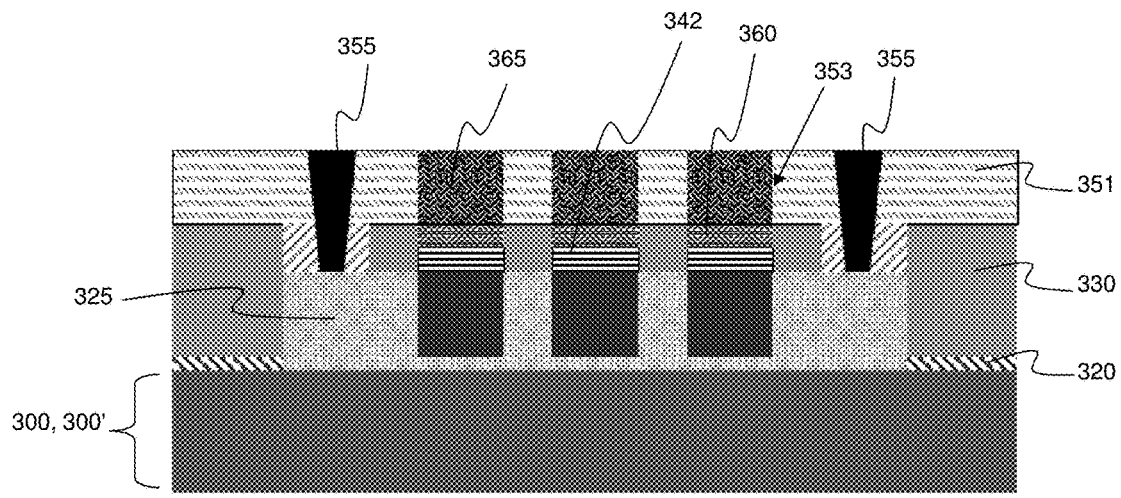

FIG. 15 shows an insulator layer 351 with patterned openings 353. The openings 353 can be filled with a p-type GaN material 360. An indium tin oxide (ITO) 365 is formed within the openings 353, in contract with the p-type GaN material 360. In embodiments, ITO 365 can be transparent electrodes. In embodiments, the GaN material 360 can be grown to a height of the nitride layer 330. Contacts 355 can also be formed directly in contact with the core region 325, i.e., the n-type GaN material, in the openings 352 using conventional lithography, etching and deposition processes. The contacts 355 can be for example, Al. In embodiments, the contacts 355 differ from the contacts 150 of FIGS. 6-11, because the contacts 355 are in direct contact with the core region 325, i.e., the n-type GaN material.

Figure 16:
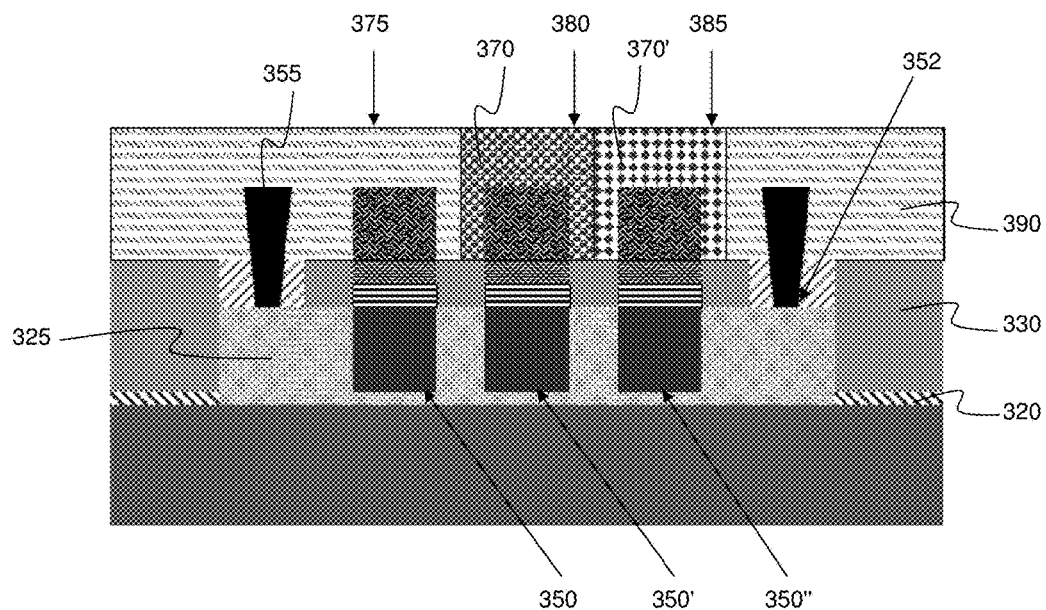

In FIG. 16, quantum well (QW) materials 370, 370', are deposited over some of the multiple quantum well regions 350, 350', 350". Specifically, the QW materials 370, 370' are deposited over the quantum well regions 350' and 350". In this representation, the quantum well regions 350', 350" can be first color emitting region, i.e., a green region, and a second color emitting region, i.e., a red region, respectively; whereas, the quantum well region 350 without the QW materials 370, 370', can be a third color emitting region, i.e., a blue region. It should be understood by those of skill in the art that the multiple quantum well regions 350, 350', 350" can be rearranged differently, e.g., a blue region, a green region and a red region, respectively.

Still referring to FIG. 16, in embodiments, the QW materials 370, 370' can be quantum dots (QD) deposited by a spin coat deposition. In other embodiments, the QW materials 370, 370' can be phosphors deposited by a spin coat deposition. Therefore, the QW material 370', which causes the emission of a red color, can deposited over the quantum well region 350", and can be QDs deposited by a spin coat deposition or phosphors deposited by a spin coat deposition. As shown in FIG. 16, the QW materials 370, 370' are sealed by the dielectric 390. The remaining unexposed quantum well 350 region will emit a blue light as depicted by blue LED 375. This arrangement of quantum well regions 350, 350', 350", form the LEDs 375, 380 and 385, and allow for three colors to be integrated on a single FIN LED structure.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming replacement fin structures with a doped core region, on doped substrate material;
   forming isolation regions between the replacement fin structures;
   forming quantum wells over the replacement fin structures;
   forming contacts between each of the replacement fin structures and contacting the substrate material through the isolation regions;
   forming a first color emitting region by depositing a first material on at least one of the quantum wells over at least a first replacement fin structure of the replacement fin structures, while protecting at least a second replacement fin structure of the replacement fin structures; and
   forming a second color emitting region by depositing a second material on another one of the quantum wells over the at least second replacement fin structure of the replacement fin structures, while protecting the first replacement fin structure and other replacement fin structures which are not to have the second material deposited thereon.

2. The method of claim 1, wherein the forming the first color emitting region and the second color emitting region by depositing the first material and the second material comprises a deposition of quantum dots.

3. The method of claim 1, wherein the forming the first color emitting region and the second color emitting region by depositing the first material and the second material comprises a spin on deposition of phosphors.

4. The method of claim 1, wherein the doped core region is an n-type GaN material.

5. The method of claim 1, further comprising forming a dielectric layer to seal the first color emitting region and the second color emitting region.

6. The method of claim 1, further comprising:
   forming cladding layers; and
   doping the replacement fin structures, prior to the forming of the cladding layers.

7. The method of claim 1, further comprising a buffer layer formed under the doped core region.

8. The method of claim 7, wherein the buffer layer is AlN.

9. The method of claim 1, further comprising forming cladding layers which comprise alternating InGaN and GaN materials.

10. The method of claim 9, further comprising forming a p-type GaN layer over the cladding layers, and an insulator layer over the p-type GaN layer, wherein the forming of the first color emitting region and the second color emitting region comprises doping the insulator layer.

11. The method of claim 1, wherein forming the contacts comprises forming a reflective material to form mirrors between the replacement fin structures, the reflective mirrors contacting the doped substrate material.

12. The method of claim 11, further comprising sealing the replacement fin structures and the mirrors with a dielectric layer to form the light emitting diode structures.

13. A method comprising:
forming doped fin structures of a substrate material;
recessing the doped fin structures;
forming doped replacement fin structures on the recessed doped fin structures;
forming isolation regions between the doped replacement fin structures;
forming alternating cladding layers on the doped replacement fin structures;
forming contacts between each of the doped replacement fin structures and contacting the substrate material through the isolation regions;
forming a first mask over at least a first doped replacement fin structure;
forming a first color emitting region over at least a second doped replacement fin structure, while protecting the first doped replacement fin structure with the mask;
removing the first mask;
forming second mask over the at least the first coloring emitting region and the second doped replacement fin structure;
forming a second color emitting region over at least a third doped replacement fin structure, while protecting the at least first coloring emitting region with the second mask; and
forming a cathode through the isolation regions and contacting the substrate material.

14. The method of claim 13, wherein the forming the first color emitting region and the forming of the second color emitting region comprises a deposition of quantum dots.

15. The method of claim 13, wherein the forming the first color emitting region and the forming of the second color emitting region comprises a spin on deposition of phosphors.

16. The method of claim 13, wherein the cladding layers form a quantum well.

17. The method of claim 13, further comprising a buffer layer formed under the doped core region.

18. The method of claim 13, wherein the alternating cladding layers comprise InGaN and GaN materials.

19. The method of claim 18, wherein forming the contacts comprises forming a reflective material to form mirrors between the doped replacement fin structures.

20. The method of claim 18, further comprising an insulator layer over the alternating cladding layers.

* * * * *